United States Patent
Lin et al.

(10) Patent No.: US 10,804,205 B1
(45) Date of Patent: Oct. 13, 2020

(54) INTERCONNECT SUBSTRATE WITH STIFFENER AND WARP BALANCER AND SEMICONDUCTOR ASSEMBLY USING THE SAME

(71) Applicant: BRIDGE SEMICONDUCTOR CORP., Taipei (TW)

(72) Inventors: Charles W. C. Lin, Singapore (SG); Chia-Chung Wang, Hsinchu County (TW)

(73) Assignee: BRIDGE SEMICONDUCTOR CORP., Taipei (TW)

( * ) Notice: Subject to any disclaimer, the term of this patent is extended or adjusted under 35 U.S.C. 154(b) by 0 days.

(21) Appl. No.: 16/548,224

(22) Filed: Aug. 22, 2019

(51) Int. Cl.
  *H01L 23/538* (2006.01)
  *H01L 23/00* (2006.01)
  *H01L 23/498* (2006.01)

(52) U.S. Cl.
  CPC .... *H01L 23/5383* (2013.01); *H01L 23/49816* (2013.01); *H01L 23/49822* (2013.01); *H01L 24/09* (2013.01); *H01L 2224/02371* (2013.01); *H01L 2924/3511* (2013.01)

(58) Field of Classification Search
  CPC ........... H01L 23/5383; H01L 23/49816; H01L 23/49822; H01L 24/09; H01L 2224/02371; H01L 2924/3511
  See application file for complete search history.

(56) References Cited

U.S. PATENT DOCUMENTS

| | | |
|---|---|---|
| 8,400,776 B2 | 3/2013 | Sahara et al. |
| 8,446,736 B2 | 5/2013 | Kita et al. |
| 8,450,616 B2 | 5/2013 | Chang |
| 8,519,270 B2 | 8/2013 | Chang |
| 8,735,739 B2 | 5/2014 | Ishihara et al. |
| 8,942,003 B2 | 1/2015 | Sahara et al. |
| 9,084,342 B2 | 7/2015 | Chang |
| 9,085,826 B2 | 7/2015 | Ajoian |
| 9,258,908 B2 | 2/2016 | Chang et al. |
| 9,282,626 B2 | 3/2016 | Yoo et al. |
| 9,301,407 B2 | 3/2016 | Miyazaki et al. |
| 9,340,003 B2 | 5/2016 | Chang |
| 9,549,468 B1 | 1/2017 | Tsai et al. |
| 9,578,745 B2 | 2/2017 | Yoshikawa et al. |
| 9,609,746 B1 | 3/2017 | Chiang et al. |
| 9,646,852 B2 | 5/2017 | Chang et al. |
| 9,673,140 B2 | 6/2017 | Chen et al. |
| 9,723,729 B2 | 8/2017 | Furusawa et al. |
| 9,812,387 B2 | 11/2017 | Tsai et al. |

(Continued)

*Primary Examiner* — Peniel M Gumedzoe
(74) *Attorney, Agent, or Firm* — Muncy, Geissler, Olds & Lowe, PC

(57) ABSTRACT

The interconnect substrate mainly includes a stiffener, a core layer, a warp balancer and a routing circuitry. The stiffener has an elastic modulus higher than 100 GPa and is laterally surrounded by the core layer. The warp balancer is disposed over the top surface of the core layer and laterally surrounds a cavity aligned with the stiffener. The routing circuitry is disposed under the bottom surfaces of the stiffener and the core layer and electrically connected to the stiffener. By the high modulus of the stiffener, local thermo-mechanical stress induced by un-even thickness can be counterbalanced. Furthermore, adjusting the ratio of the stiffener thickness to the cavity dimension can maintain the cavity area stiffness and modulate the global flatness.

21 Claims, 9 Drawing Sheets

(56) References Cited

U.S. PATENT DOCUMENTS

| | | |
|---|---|---|
| 9,832,873 B2 | 11/2017 | Chiang et al. |
| 9,860,984 B2 | 1/2018 | Wu et al. |
| 9,894,764 B2 | 2/2018 | Lee et al. |
| 9,966,333 B2 | 5/2018 | Tsai et al. |
| 9,999,131 B2 | 6/2018 | Ko et al. |
| 10,015,885 B2 | 7/2018 | Jung et al. |
| 10,032,705 B2 | 7/2018 | Lee et al. |
| 10,039,184 B2 | 7/2018 | Wu et al. |
| 10,043,726 B2 | 8/2018 | Sugiyama et al. |
| 10,051,748 B2 | 8/2018 | Chang et al. |
| 10,080,284 B2 | 9/2018 | Wu et al. |
| 10,103,113 B2 | 10/2018 | Ko et al. |
| 10,199,321 B2 | 2/2019 | Lin et al. |
| 10,306,778 B2 | 5/2019 | Lee et al. |
| 10,314,179 B2 | 6/2019 | Chang et al. |
| 10,356,901 B2 | 7/2019 | Wu et al. |
| 2019/0182997 A1* | 6/2019 | Lin .................. H05K 13/00 |
| 2019/0267307 A1* | 8/2019 | Lin .................. H01L 23/49838 |

* cited by examiner

INTERCONNECT SUBSTRATE WITH STIFFENER AND WARP BALANCER AND SEMICONDUCTOR ASSEMBLY USING THE SAME

FIELD OF THE INVENTION

The present invention relates to an interconnect substrate and, more particularly, to an interconnect substrate having a stiffener and a warp balancer incorporated therein and a semiconductor assembly using the same.

DESCRIPTION OF RELATED ART

Market trends of electronic devices such as multimedia devices demand for faster and slimmer designs. One of the approaches is to stack semiconductor chips on top of each other through a cavity substrate so that the assembled device can be compact and slim. U.S. Pat. No. 8,446,736 to Kita et al. and U.S. Pat. No. 8,400,776 to Sahara et al. disclose a circuit board in which a top portion of the board is removed so that a cavity is formed in the board. With this platform, a semiconductor chip can be placed in the cavity and another semiconductor chip can be placed on top of it to form a stacking structure. This vertically stacking structure can save space, minimize dimension and therefore achieve the purposes of slimming and compactness of mobile devices.

However, traditional resin-based cavity substrates, typically consisting of multiple resin layers 11 and multiple circuit layers 13 (as shown in FIGS. 1A and 1B), tend to warp during the repeated heating and cooling in the process of manufacturing. This is due mainly to the un-even thickness of the cavity substrate, and the thermal expansion of the lower portion doesn't match that of the top portion. For example, at high temperature such as 260 degree C., the lower portion of the resin material tends to expand more, and causes the board bending upward as shown in FIG. 1A. When reducing down to room temperature, the lower portion of resin material tends to shrink more than the top portion, and causes the board bending downward as shown in FIG. 1B. Further, the dimension of the cavity can also affect the degree of bending. For example, as a general guideline, the wider the cavity, the larger the mismatch, and the worse the warp can be. Although conventional approaches by adding a stiffener around the peripheral edges of the substrate can partially improve the general rigidity problem, the local warping problem, especially in the device-attachment area, has not been solved fundamentally.

In view of the various development stages and limitations in substrates, an urgent need exists to develop a new substrate that can address high packing density, and low profile requirements and ensure low warping during assembly and operation.

SUMMARY OF THE INVENTION

An objective of the present invention is to provide an interconnect substrate with a higher-modulus stiffener under a device-attachment cavity region so that local thermo-mechanical stress induced by un-even thickness can be counterbalanced. Furthermore, by adjusting the ratio of the thickness of the stiffener to a specific dimension of the cavity, the central area stiffness can be maintained and the global flatness can be modulated.

In accordance with the foregoing and other objectives, the present invention provides interconnect substrate, comprising: a stiffener having top contact pads at a top surface thereof and bottom contact pads at a bottom surface thereof, the top contact pads being electrically connected to the bottom contact pads; a core layer that laterally surrounds a peripheral sidewall of the stiffener; a routing circuitry that is disposed under the bottom surface of the stiffener and further laterally extends onto a bottom surface of the core layer and is electrically coupled to the bottom contact pads of the stiffener; and a warp balancer that is disposed over a top surface of the core layer and has an interior sidewall laterally surrounding a cavity, with the top contact pads of the stiffener being aligned with the cavity and a portion of the warp balancer being superimposed over the top surface of the stiffener, wherein an elastic modulus of the stiffener is higher than that of the core layer and that of the routing circuitry and a ratio of thickness in millimeters to dimension in square millimeters between the thickness of the stiffener and the dimension of the cavity is $1 \times 10^{-5}$ or more.

Additionally, the present invention also provides a semiconductor assembly that includes a first semiconductor device disposed in the cavity of the aforementioned interconnect substrate and electrically connected to the top contact pads of the stiffener.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 2-5 are cross-sectional views showing a method of making an interconnect substrate that includes a stiffener, a core layer, a warp balancer and a routing circuitry in accordance with the first embodiment of the present invention.

Figure 1A:
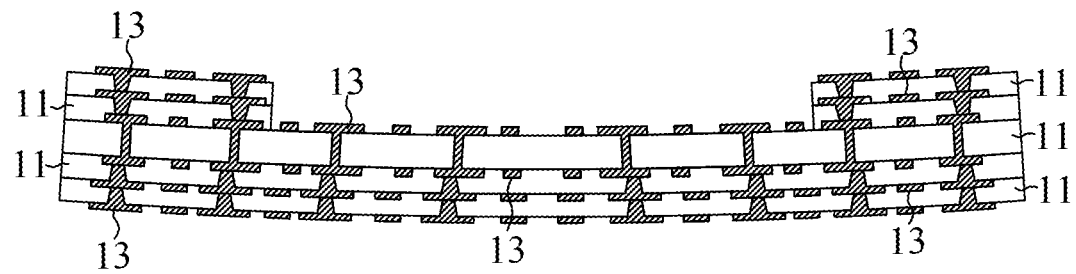
FIG. 1A is a cross-sectional view of a conventional cavity substrate when under a high temperature treatment.
Figure 1B:
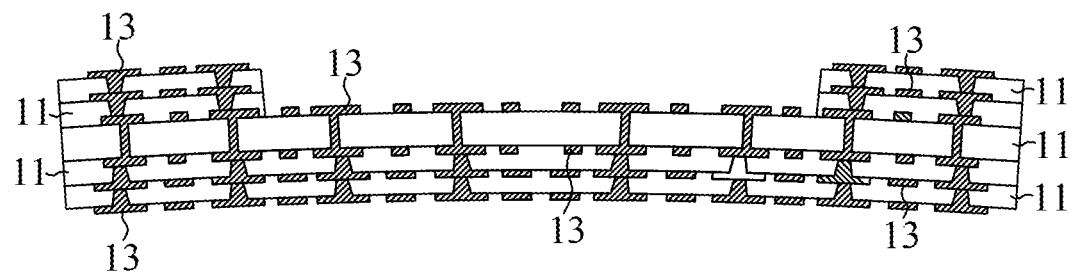
FIG. 1B is a cross-sectional view of a conventional cavity substrate when after heat treatment.
Figure 2:
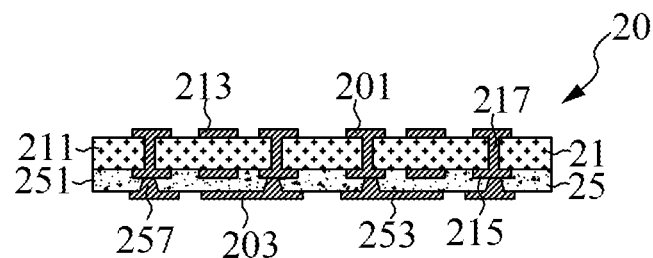
FIG. 2 is a cross-sectional view of a stiffener in accordance with the first embodiment of the present invention.

FIG. 2 is a cross-sectional view of a stiffener 20 having top contact pads 201 and bottom contact pads 203 at its top and bottom surfaces, respectively. In this illustration, the stiffener 20 includes a supporting base 21 and a bottom redistribution circuitry 25 disposed under the bottom surface of the supporting base 21. Preferably, the stiffener 20 has an elastic modulus higher than 100 GPa so as to maintain the flatness of device-attachment region. For the required stiffness, the supporting base 21 typically is made of a high-modulus material. More specifically, the supporting base 21 may include a base plate 211 made of a high-modulus inorganic material, a top wiring layer 213 on the top surface of the base plate 211, a bottom wiring layer 215 on the bottom surface of the base plate 211, and metallized through vias 217 penetrating through the base plate 211. The top wiring layer 213 at the top surface of the supporting base 21 provides the top contact pads 201 for subsequent device attachment and is electrically connected to the bottom wiring layer 215 at the bottom surface of the supporting base 21 through the metallized through vias 217 in connection with the top wiring layer 213 and the bottom wiring layer 215. In this embodiment, the bottom redistribution circuitry 25 is illustrated as a multi-layered build-up circuitry and includes a bottom insulating layer 251 and a bottom routing layer 253 serially formed in an alternate fashion. The bottom insulating layer 251 contacts and covers and extends laterally on the bottom surface of the supporting base 21 from below. The bottom routing layer 253 extends laterally on the bottom insulating layer 251 to provide the bottom contact pads 203 for next-level electrical connection and includes metallized vias 257 in direct contact with the bottom wiring layer 215 of the supporting base 21. As a result, the top contact pads 201 and the bottom contact pads 203 of the stiffener 20 are electrically connected to each other through the metallized vias 257 and the metallized through vias 217.

Figure 3:
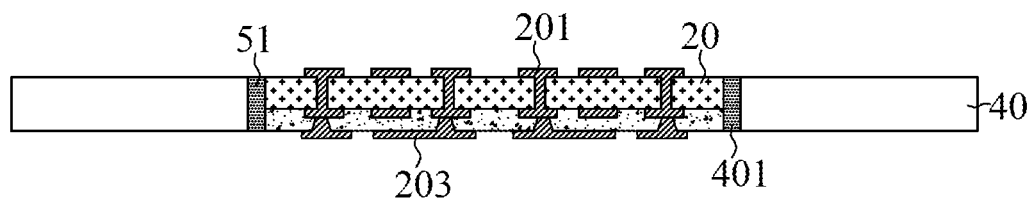
FIG. 3 is a cross-sectional view of the structure of FIG. 2 further provided with a core layer in accordance with the first embodiment of the present invention.

FIG. 3 is a cross-sectional view of the structure with the stiffener 20 attached in a through opening 401 of a core layer 40 using a resin adhesive 51. The stiffener 20 is spaced from and adhered to the inner sidewall of the through opening 401 of the core layer 40 using the resin adhesive 51 in a gap between the peripheral sidewall of the stiffener 20 and the inner sidewall of the through opening 401. The material of the core layer 40 is not particularly limited and may be any organic or inorganic material.

Figure 4:
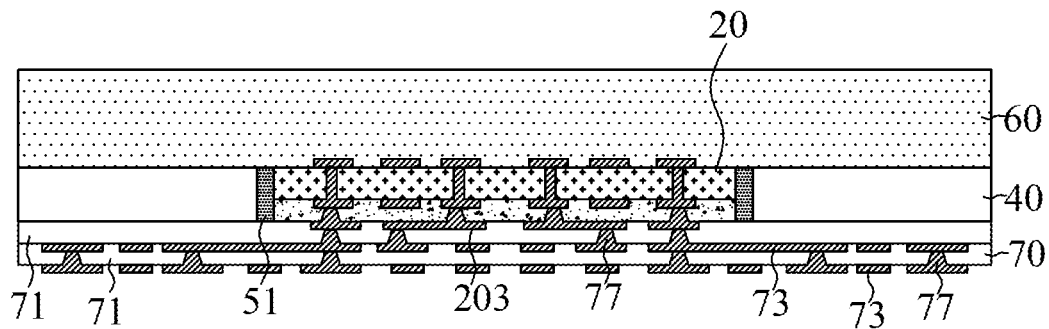
FIG. 4 is a cross-sectional view of the structure of FIG. 3 further provided with a warp balancer and a routing circuitry in accordance with the first embodiment of the present invention.

FIG. 4 is a cross-sectional view of the structure provided with a warp balancer 60 and a routing circuitry 70 on two opposite sides of the stiffener 20 and the core layer 40. The warp balancer 60 is disposed over the top surfaces of the stiffener 20 and the core layer 40 as well as the resin adhesive 51, whereas the routing circuitry 70 is disposed under the bottom surfaces of the stiffener 20 and the core layer 40 as well as the resin adhesive 51. The warp balancer 60, typically containing a resin-based material, is used to suppress bending or warpage of the structure, so that the coefficient of thermal expansion (CTE) of the warp balancer 60 preferably is substantially equal to or close to that of the routing circuitry 70. More specifically, for effectively maintaining the required flatness of the structure, the difference in CTE between the warp balancer 60 and the routing circuitry 70 preferably is controlled to be less than 20 ppm/° C. Further, in some cases, the thickness of the warp balancer 60 is also controlled to be substantially equal to or close to that of the routing circuitry 70 for strict flatness requirement. In this embodiment, the routing circuitry 70 is illustrated as a multi-layered build-up circuitry and includes multiple dielectric layers 71 and multiple conductive trace layers 73 serially formed in an alternate fashion. Each conductive trace layer 73 extends laterally on its corresponding dielectric layer 71 and includes metallized vias 77 in the dielectric layer 71. As a result, the conductive trace layers 73 can be electrically coupled to each other through the metallized vias 77. Likewise, the innermost conductive trace layer 73 can be electrically coupled to the bottom contact pads 203 of the stiffener 20 through the metallized vias 77.

Figure 5:
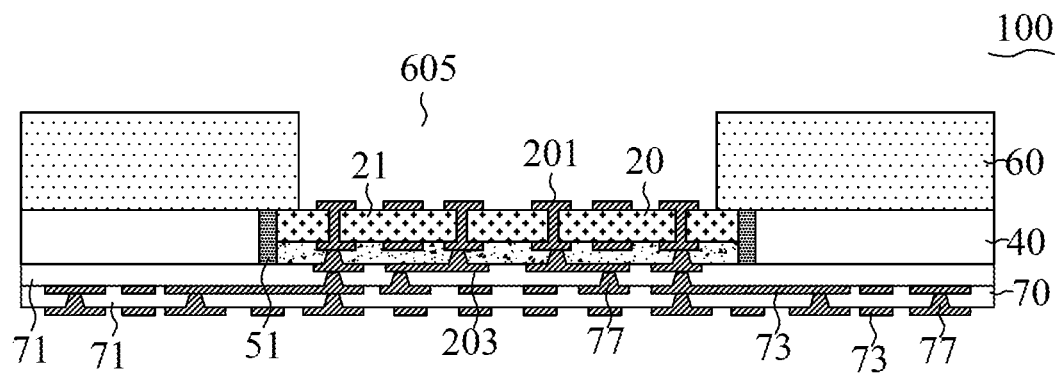
FIG. 5 is a cross-sectional view of the structure of FIG. 4 further formed with a cavity to finish the fabrication of an interconnect substrate in accordance with the first embodiment of the present invention.

FIG. 5 is a cross-sectional view of the structure after partial removal of the warp balancer 60. A selected portion of the warp balancer 60 is removed to form a cavity 605 superimposed over the top surface of the stiffener 20. As a result, the top contact pads 201 of the stiffener 20 are aligned with and exposed from the cavity 605 from above. Preferably, the ratio of the thickness of the stiffener 20 in millimeters to the opening area of the cavity 605 in square millimeters is $1 \times 10^{-5}$ or more. By adjusting the ratio of the stiffener thickness to the cavity dimension, the stiffness of the cavity region can be maintained so as to suppress bending or deformation at the cavity region. In this embodiment, the stiffener 20 laterally extends beyond the periphery of the cavity 605 and has a peripheral portion under the warp balancer 60 to provide support for the inner edge portion of the warp balancer 60, thereby enhancing the mechanical reliability of the entire structure.

Accordingly, an interconnect substrate 100 is accomplished and includes the stiffener 20, the core layer 40, the resin adhesive 51, the warp balancer 60 and the routing circuitry 70. The stiffener 20 can counterbalance local thermo-mechanical stress induced by un-even thickness and provides a high-modulus reliable and flat interface for chip assembled in the cavity 605. In this embodiment, the elastic modulus of the stiffener 20 is greater than those of the core layer 40, the warp balancer 60 and the routing circuitry 70. Additionally, in some thermally enhanced cases, the thermal conductivity of the stiffener 20 preferably is higher than those of the core layer 40, the warp balancer 60 and the routing circuitry 70. As a result, the stiffener 20 not only resolves the warping problems, but also can serve as a heat spreader to enhance thermal dissipation. The core layer 40 is bonded around the peripheral sidewall of the stiffener 20 by the resin adhesive 51 and located between the warp balancer 60 and the routing circuitry 70. The warp balancer 60 has matched CTE with the routing circuitry 70 to prevent bending or deformation of the interconnect substrate 100 caused by mismatched CTE. The routing circuitry 70 is electrically coupled to the stiffener 20 and provides fan-out routing/interconnection for next-level connection.

Figure 6:
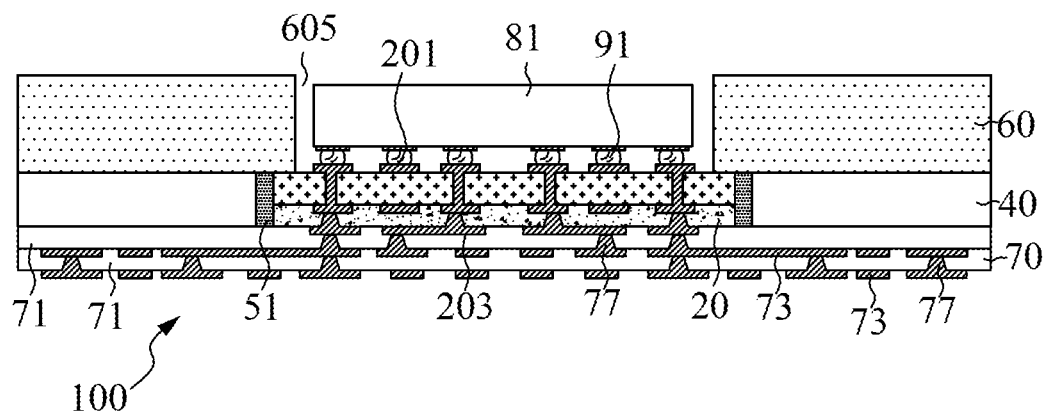
FIG. 6 is a cross-sectional view of a semiconductor assembly having a first semiconductor device electrically connected to the interconnect substrate of FIG. 5 in accordance with the first embodiment of the present invention.

FIG. 6 is a cross-sectional view of a semiconductor assembly with a first semiconductor device 81 electrically connected to the interconnect substrate 100 illustrated in FIG. 5. The first semiconductor device 81, illustrated as a chip, is disposed in the cavity 605 and face-down mounted on the top contact pads 201 of the stiffener 20 through bumps 91. As the cavity region is completely covered by the high-modulus stiffener 20 from the cavity bottom and the ratio between the stiffener thickness and the cavity dimension is well controlled, the bending or deformation of the interconnect substrate 100 can be effectively suppressed to avoid electrical connection failure between the first semiconductor device 81 and the stiffener 20.

Figure 7:
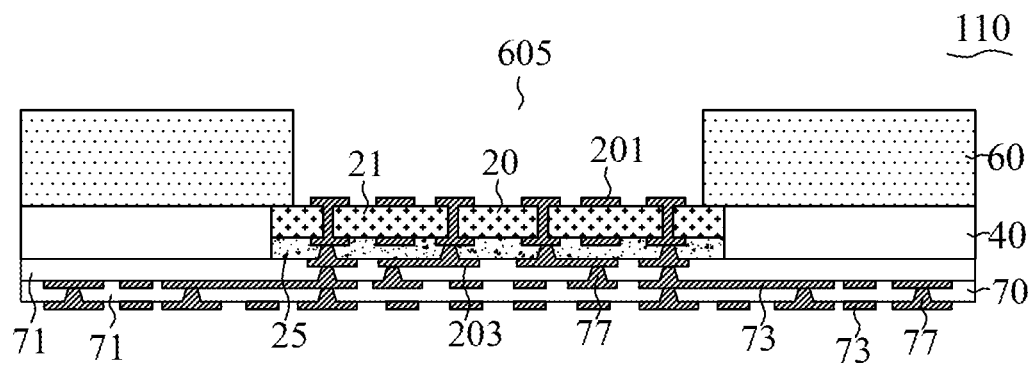
FIG. 7 is a cross-sectional view of another aspect of the interconnect substrate in accordance with the first embodiment of the present invention.

FIG. 7 is a cross-sectional view of another aspect of the interconnect substrate in accordance with the first embodiment of the present invention. The interconnect substrate 110 is similar to that illustrated in FIG. 5, except that the core layer 40 laterally surrounds and conformally coats and directly contacts the peripheral sidewall of the stiffener 20 without any resin adhesive between the stiffener 20 and the core layer 30.

Figure 8:
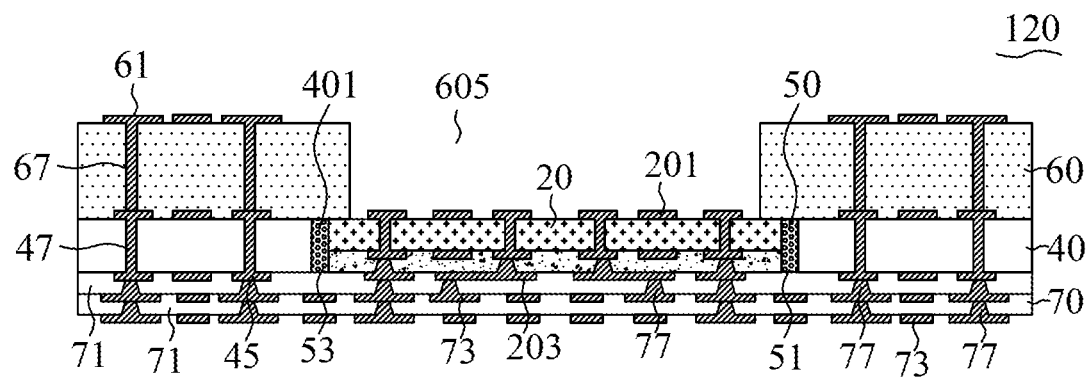
FIG. 8 is a cross-sectional view of yet another aspect of the interconnect substrate in accordance with the first embodiment of the present invention.

FIG. 8 is a cross-sectional view of yet another aspect of the interconnect substrate in accordance with the first embodiment of the present invention. The interconnect substrate 120 is similar to that illustrated in FIG. 5, except that (i) a plurality of modulators 53 are dispensed in the resin adhesive 51 to form a modified binding matrix 50 in the gap between the peripheral sidewall of the stiffener 20 and the inner sidewall of the through opening 401 of the core layer 40, (ii) the core layer 40 has first vertical connecting elements 47, and (iii) the warp balancer 60 has second vertical connecting elements 67. The CTE of the modulators 53 typically is lower than that of the resin adhesive 51 so as to effectively reduce the risk of resin cracking. For significant effect, the CTE of the modulators 53 preferably is lower by at least 10 ppm/° C. than that of the resin adhesive 51. In this embodiment, the modified binding matrix 50 contains the modulators 53 in an amount of at least 30% by volume based on the total volume of the gap, and preferably has a coefficient of thermal expansion of lower than 50 ppm/° C. As a result, the internal expansion and shrinkage of the modified binding matrix 50 during thermal cycling can be alleviated so as to restrain its cracking. Additionally, for effectively releasing thermo-mechanical induced stress, the modified binding matrix 50 preferably has a sufficient width of more than 10 micrometers (more preferably 25 micrometers or more) in the gap to absorb the stress. The first vertical connecting elements 47 provide electrical connection pathways between the top and bottom surfaces of the core layer 40 and are electrically coupled to the routing circuitry 70 through additional metallized vias 77 of the routing circuitry 70 in contact with the bottom patterned metal 45 of the core layer 40. The second vertical connecting elements 67 provide electrical connection pathways between the top and bottom surfaces of the warp balancer 60 and are electrically connected to the first vertical connecting elements 47. As a result, top conductive pads 61 provided on the top surface of the warp balancer 60 can be electrically connected to the routing circuitry 70 through the first connecting elements 47 and the second vertical connecting elements 67.

Figure 9:
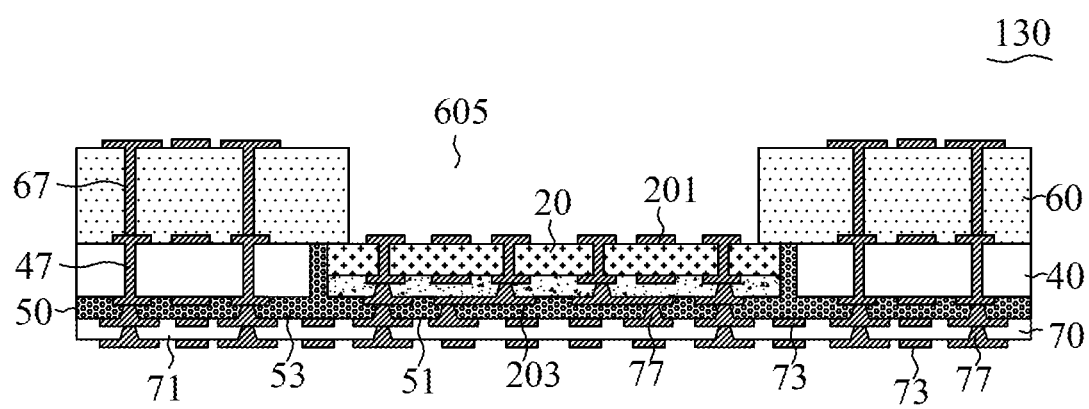
FIG. 9 is a cross-sectional view of yet another aspect of the interconnect substrate in accordance with the first embodiment of the present invention.

FIG. 9 is a cross-sectional view of yet another aspect of the interconnect substrate in accordance with the first embodiment of the present invention. The interconnect substrate 130 is similar to that illustrated in FIG. 8, except that the modified binding matrix 50 further extends outside of the gap and further covers the bottom surface of the stiffener 20 and the bottom surface of the core layer 40, and the innermost conductive trace layer 73 of the routing circuitry 70 laterally extends on the modified binding matrix 50 and includes metallized vias 77 in the modified binding matrix 50 for electrical connection with the stiffener 20 and the core layer 40. In this aspect, the modified binding matrix 50 contains the modulators 53 in an amount of at least 30% by volume based on the total volume of the modified binding matrix 50.

Embodiment 2

Figure 10:
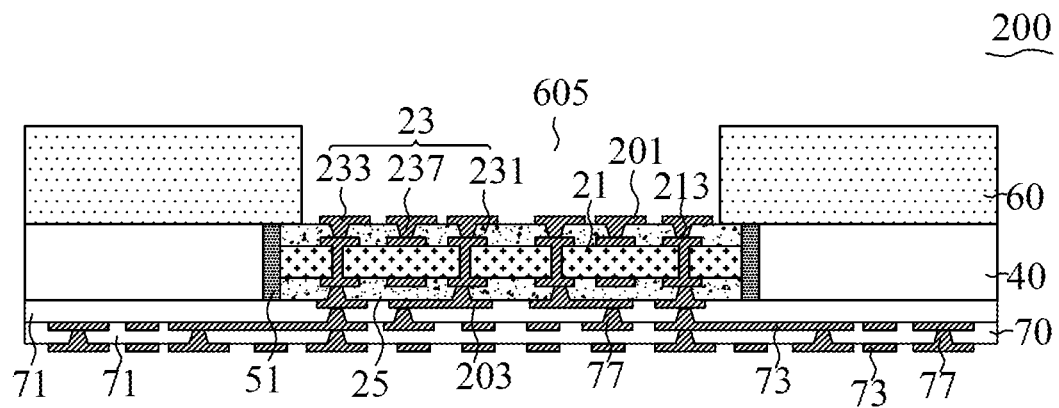
FIG. 10 is a cross-sectional view of an interconnect substrate in accordance with the second embodiment of the present invention.

FIG. 10 is a cross-sectional view of an interconnect substrate in accordance with the second embodiment of the present invention.

For purposes of brevity, any description in Embodiment 1 is incorporated herein in so far as the same is applicable, and the same description need not be repeated.

The interconnect substrate 200 is similar to that illustrated in FIG. 5, except that the stiffener 20 further includes a top redistribution circuitry 23 disposed over the top surface of the supporting base 21. In this embodiment, the top redistribution circuitry 25 is illustrated as a multi-layered build-up circuitry and includes a top insulating layer 231 and a top routing layer 233 serially formed in an alternate fashion. The top insulating layer 231 contacts and covers and extends laterally on the top surface of the supporting base 21 from above. The top routing layer 233 extends laterally on the top insulating layer 231 to provide the top contact pads 201 for subsequent device attachment and includes metallized vias 237 in direct contact with the top wiring layer 213 of the supporting base 21. As a result, the top redistribution circuitry 23, exposed from the cavity 605 and partially covered by the warp balancer 60, is electrically connected to the routing circuitry 70 through the supporting base 21 and the bottom redistribution circuitry 25.

Figure 11:
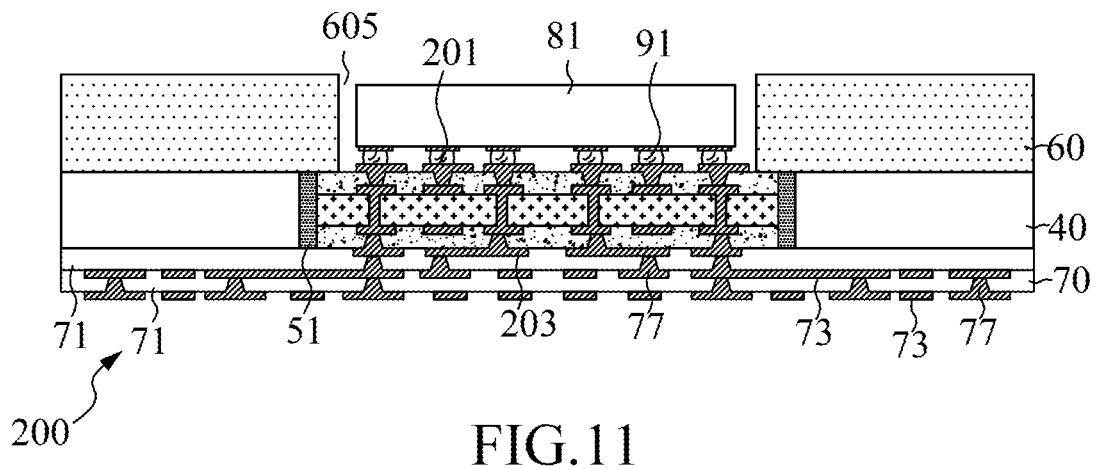
FIG. 11 is a cross-sectional view of a semiconductor assembly having a first semiconductor device electrically connected to the interconnect substrate of FIG. 10 in accordance with the second embodiment of the present invention.

FIG. 11 is a cross-sectional view of a semiconductor assembly with a first semiconductor device 81 electrically connected to the interconnect substrate 200 illustrated in FIG. 10. The first semiconductor device 81 is disposed within the cavity 605 and face-down mounted on the top contact pads 201 of the stiffener 20 through bumps 91. As a result, the first semiconductor device 81 is electrically connected to the routing trace 70 through the stiffener 20 which provides a high-modulus and flat platform to ensure the reliable connection between the first semiconductor device 81 and the interconnect substrate 200.

Figure 12:
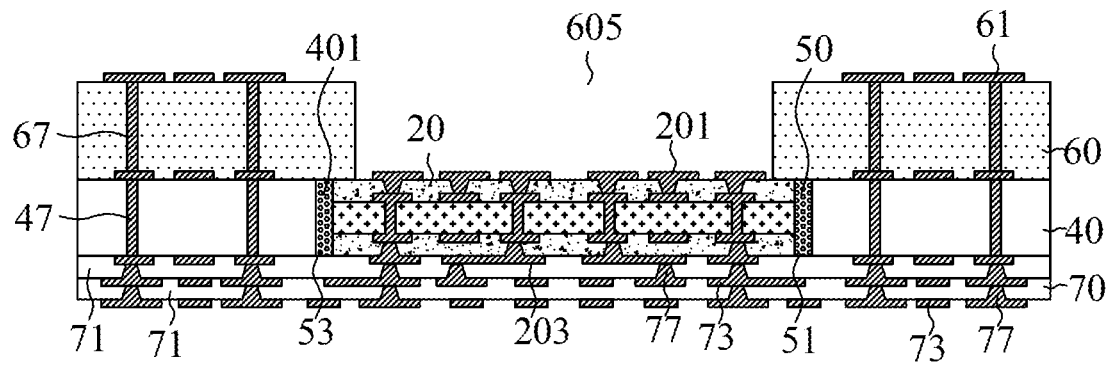
FIG. 12 is a cross-sectional view of another aspect of the interconnect substrate in accordance with the second embodiment of the present invention.

FIG. 12 is a cross-sectional view of another aspect of the interconnect substrate in accordance with the second embodiment of the present invention. The interconnect substrate 210 is similar to that illustrated in FIG. 10, except that the resin adhesive 51 is further blended with low-CTE modulators 53, and the core layer 40 and the warp balancer 60 have first vertical connecting elements 47 and second vertical connecting elements 67, respectively. The low-CTE modulators 53 are dispersed in the resin adhesive 51 to reduce the risk of resin cracking. The first vertical connecting elements 47 provide electrical connection between the routing circuitry 70 and the second vertical connecting elements 67. As a result, the top conductive pads 61 provided on the top surface of the warp balancer 60 can be electrically connected to the routing circuitry 70 through the first connecting elements 47 and the second vertical connecting elements 67.

Embodiment 3

Figure 13:
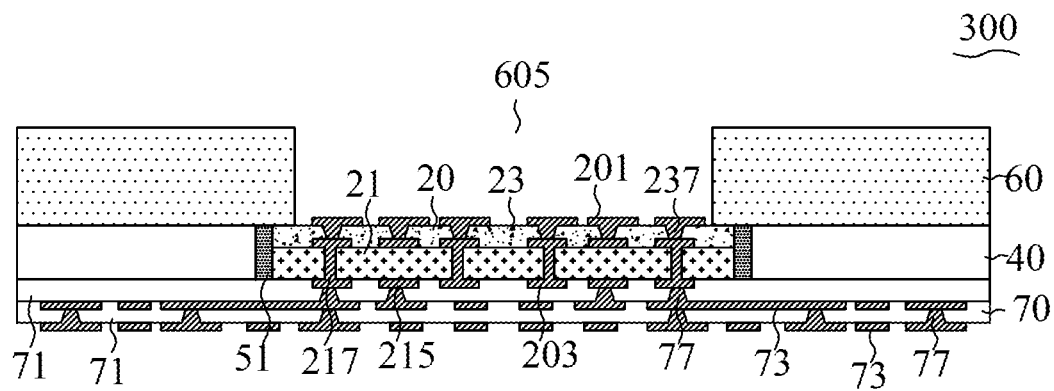
FIG. 13 is a cross-sectional view of an interconnect substrate in accordance with the third embodiment of the present invention.

FIG. 13 is a cross-sectional view of an interconnect substrate in accordance with the third embodiment of the present invention.

For purposes of brevity, any description in the Embodiments above is incorporated herein in so far as the same is applicable, and the same description need not be repeated.

The interconnect substrate 300 is similar to that illustrated in FIG. 10, except that the stiffener 20 includes no bottom redistribution circuitry between the supporting base 21 and the routing circuitry 70. In this embodiment, the supporting base 21 is electrically coupled to the routing circuitry 70 through metallized vias 77 in contact with the bottom wiring layer 215 of the supporting base 21. As a result, the top contact pads 201 and the bottom contact pads 203 of the stiffener 20 are electrically connected to each other through the metallized vias 237 of the top redistribution circuitry 23 and the metallized through vias 217 of the supporting base 21.

Figure 14:
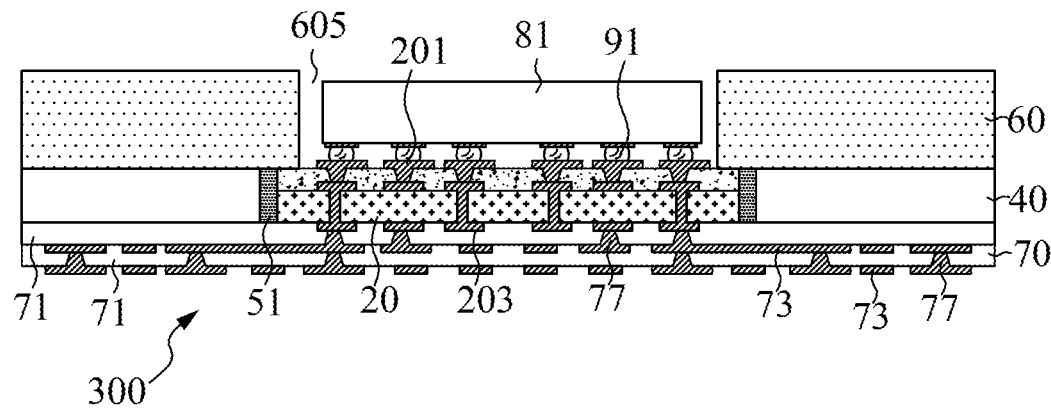
FIG. 14 is a cross-sectional view of a semiconductor assembly having a first semiconductor device electrically connected to the interconnect substrate of FIG. 13 in accordance with the third embodiment of the present invention.

FIG. 14 is a cross-sectional view of a semiconductor assembly with a first semiconductor device 81 electrically connected to the interconnect substrate 300 illustrated in FIG. 13. The first semiconductor device 81 is disposed within the cavity 605 and flip-chip mounted on the stiffener 20 through bumps 91. As a result, the first semiconductor device 81 is laterally surrounded by the warp balancer 60 and electrically connected to the routing circuitry 70 through the bumps 91 in contact with the top contact pads 201 of the stiffener 20.

Figure 15:
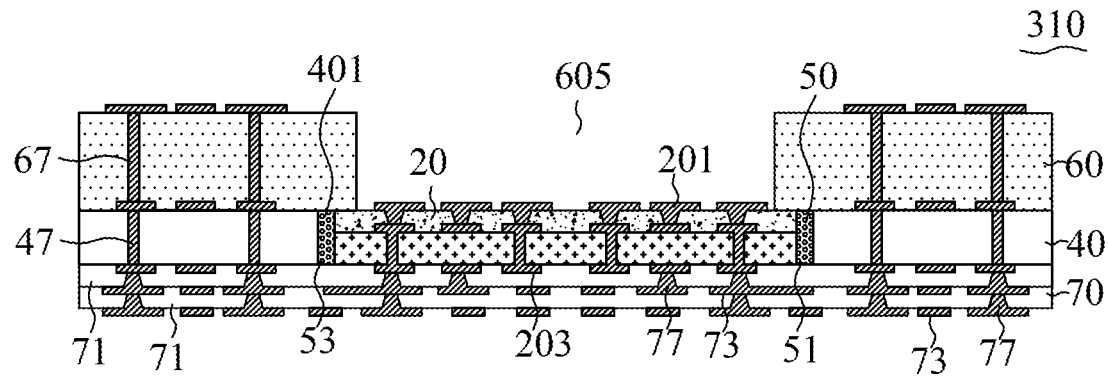
FIG. 15 is a cross-sectional view of another aspect of the interconnect substrate in accordance with the third embodiment of the present invention.

FIG. 15 is a cross-sectional view of another aspect of the interconnect substrate in accordance with the third embodiment of the present invention. The interconnect substrate 310 is similar to that illustrated in FIG. 13, except that the resin adhesive 51 is further blended with low-CTE modulators 53 to reduce the risk of resin cracking, and the warp balancer 60 includes top conductive pads 61 located at its top surface and electrically connected to the routing circuitry 70 through first vertical connecting elements 47 in the core layer 40 and second vertical connecting elements 67 in the warp balancer 60.

Embodiment 4

Figure 16:
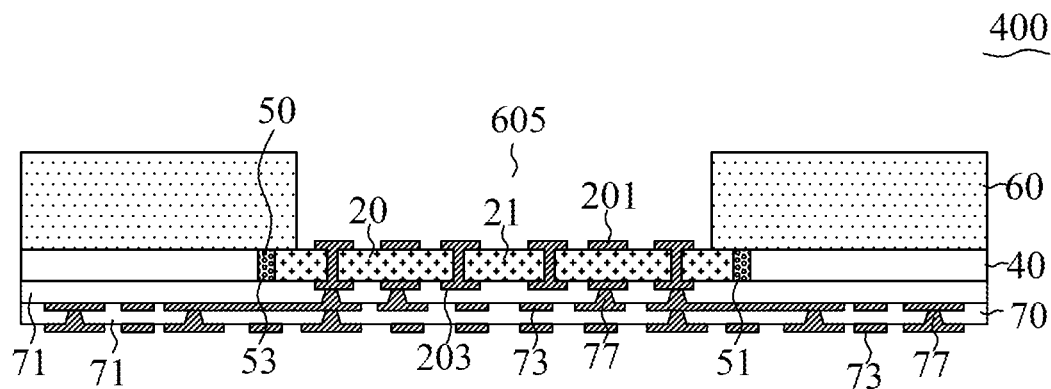
FIG. 16 is a cross-sectional view of an interconnect substrate in accordance with the fourth embodiment of the present invention.

FIG. 16 is a cross-sectional view of an interconnect substrate in accordance with the fourth embodiment of the present invention.

For purposes of brevity, any description in the Embodiments above is incorporated herein in so far as the same is applicable, and the same description need not be repeated.

The interconnect substrate 400 is similar to that illustrated in FIG. 13, except that low-CTE modulators 53 are dispensed in the resin adhesive 51 to form a modified binding matrix 50, and the stiffener 20 only includes the supporting base 21 without top redistribution circuitry thereon. In this embodiment, the supporting base 21 is exposed from the cavity 605 and an inner edge portion of the warp balancer 60 is superimposed over and contacts the top surface of the supporting base 21 of the stiffener 20.

Figure 17:
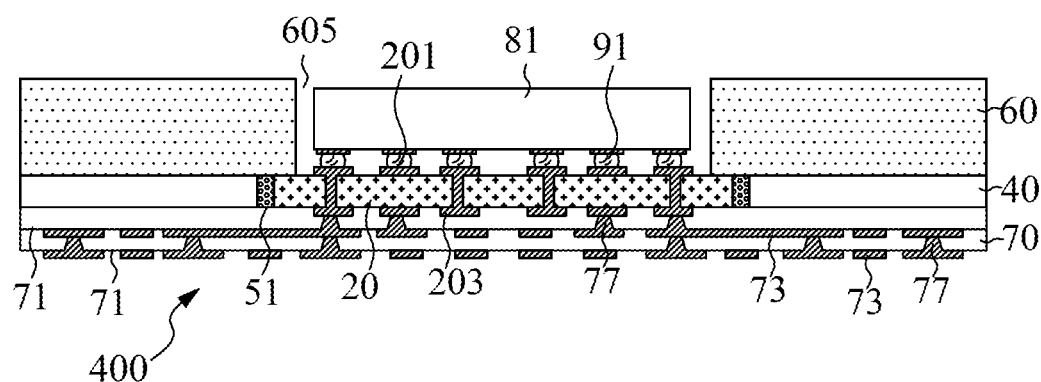
FIG. 17 is a cross-sectional view of a semiconductor assembly having a first semiconductor device electrically connected to the interconnect substrate of FIG. 16 in accordance with the fourth embodiment of the present invention.

FIG. 17 is a cross-sectional view of a semiconductor assembly with a first semiconductor device 81 electrically connected to the interconnect substrate 400 illustrated in FIG. 16. The first semiconductor device 81 is face-down disposed within the cavity 605 and electrically connected to the top contact pads 201 of the stiffener 20 through bumps 91. As a result, the first semiconductor device 81 is electrically connected to the interconnect substrate 400 through the high-modulus stiffener 20 at the bottom of the cavity 605 laterally surrounded by the interior sidewall of the warp balancer 60.

Figure 18:
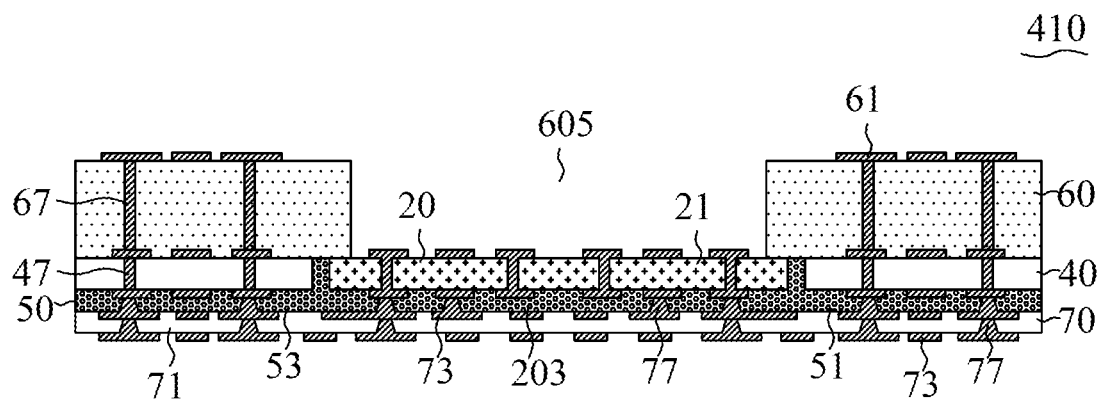
FIG. 18 is a cross-sectional view of another aspect of the interconnect substrate in accordance with the fourth embodiment of the present invention.

FIG. 18 is a cross-sectional view of another aspect of the interconnect substrate in accordance with the fourth embodiment of the present invention. The interconnect substrate 410 is similar to that illustrated in FIG. 16, except that the modified binding matrix 50 further extends outside of the gap and further covers and contacts the bottom surface of the supporting base 21 and the bottom surface of the core layer 40, and the core layer 40 and the warp balancer 60 have first vertical connecting elements 47 and second vertical connecting elements 67, respectively. Through the first connecting elements 47 and the second vertical connecting elements 67, the top conductive pads 61 provided on the top surface of the warp balancer 60 can be electrically connected to the routing circuitry 70.

Embodiment 5

Figure 19:
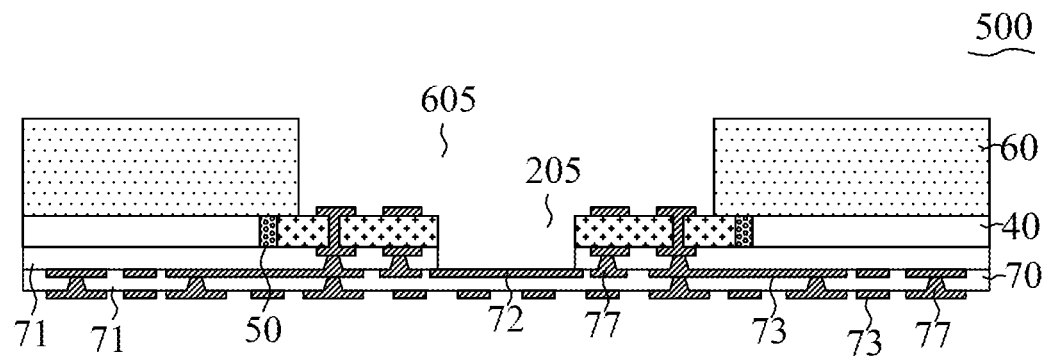
FIG. 19 is a cross-sectional view of an interconnect substrate in accordance with the fifth embodiment of the present invention.

FIG. 19 is a cross-sectional view of an interconnect substrate in accordance with the fifth embodiment of the present invention.

For purposes of brevity, any description in the Embodiments above is incorporated herein in so far as the same is applicable, and the same description need not be repeated.

The interconnect substrate 500 is similar to that illustrated in FIG. 16, except that the stiffener 20 further has an aperture 205 aligned with the cavity 605, and the routing circuitry 70 includes a metal paddle 72 exposed from the aperture 205 and the cavity 605. The aperture 205 can be formed by removing a portion of the stiffener 20 and optionally partial routing circuitry 70 and has a smaller dimension than that of the cavity 605. In this embodiment, the aperture 205 extends through the stiffener 20 and further extends into the innermost dielectric layer 71 of the routing circuitry 70.

Figure 20:
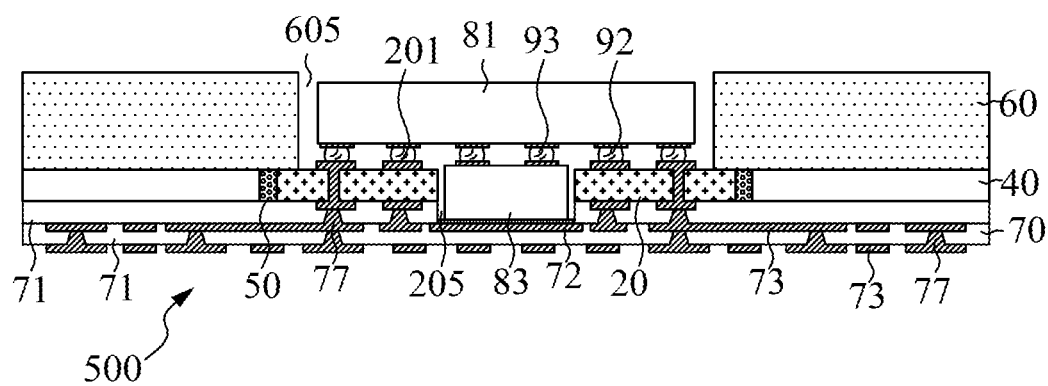
FIG. 20 is a cross-sectional view of a semiconductor assembly having a first semiconductor device and a second semiconductor device electrically connected to the interconnect substrate of FIG. 19 in accordance with the fifth embodiment of the present invention.

FIG. 20 is a cross-sectional view of a semiconductor assembly with a first semiconductor device 81 and a second semiconductor device 83 packaged in the interconnect substrate 500 illustrated in FIG. 19. The first semiconductor device 81 is face-down disposed within the cavity 605 and electrically connected to the top contact pads 201 of the stiffener 20 through first bumps 91. The second semiconductor device 83 is face-up disposed within the aperture 205 and electrically connected to the first semiconductor device 81 through second bumps 93 and is attached to the metal paddle 72.

Figure 21:
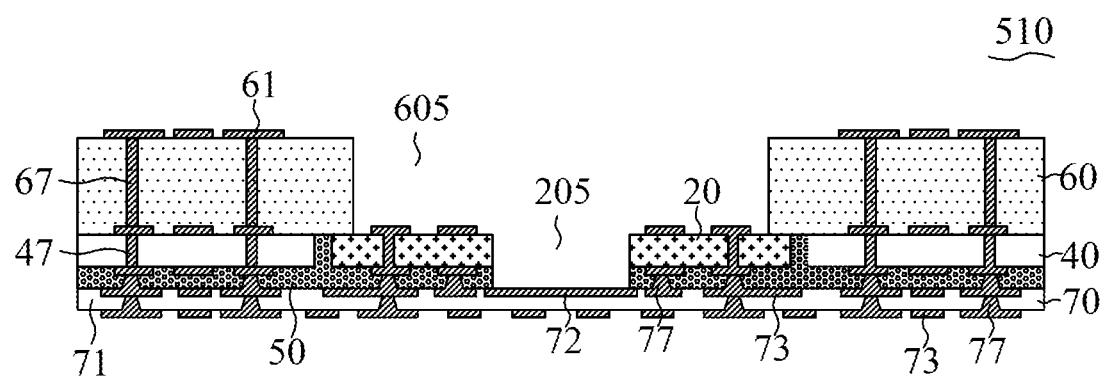
FIG. 21 is a cross-sectional view of another aspect of the interconnect substrate in accordance with the fifth embodiment of the present invention.

FIG. 21 is a cross-sectional view of another aspect of the interconnect substrate in accordance with the fifth embodiment of the present invention. The interconnect substrate 510 is similar to that illustrated in FIG. 19, except that the modified binding matrix 50 further extends outside of the gap and further covers the bottom surface of the stiffener 20 and the bottom surface of the core layer 40, and the warp balancer 60 includes top conductive pads 61 located at its top surface and electrically connected to the routing circuitry 70 through first vertical connecting elements 47 in the core layer 40 and second vertical connecting elements 67 in the warp balancer 60. In this aspect, the aperture 205 extends through the stiffener 20 and further extends into the modified binding matrix 50.

Embodiment 6

FIGS. 22-25 are cross-sectional views showing a method of making yet another interconnect substrate in accordance with the sixth embodiment of the present invention.

For purposes of brevity, any description in Embodiments above is incorporated herein in so far as the same is applicable, and the same description need not be repeated.

Figure 22:
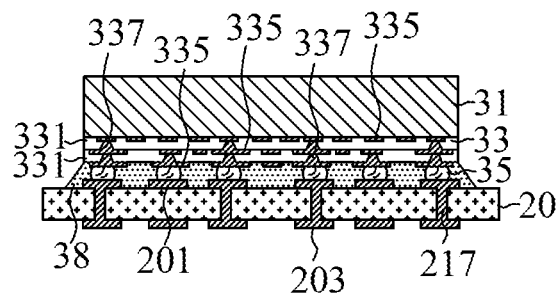
FIG. 22 is a cross-sectional view of the structure having a build-up circuitry adhered to a sacrificial carrier and soldered on a stiffener in accordance with the sixth embodiment of the present invention.

FIG. 22 is a cross-sectional view of the structure having a build-up circuitry 33 adhered to a sacrificial carrier 31 and soldered on a stiffener 20. The build-up circuitry 33 can be directly formed on the sacrificial carrier 31 through buildup process, and then mounted on the top surface of the stiffener 20 that includes top contact pads 201, bottom contact pads 203 and metallized through vias 217. In this illustration, the build-up circuitry 33 includes multiple insulating layers 331 and multiple routing layers 335 serially formed on the sacrificial carrier 31 in an alternate fashion. The routing layers 335 are electrically coupled to each other through metallized vias 337 in the insulating layers 331, and the bottommost routing layer 335 is electrically coupled to the top contact pads 201 of the stiffener 20 through the solder balls 35 between the stiffener 20 and the build-up circuitry 33. As a result, the routing layers 335 of the build-up circuitry 33 can be electrically connected to the bottom contact pads 203 of the stiffener 20 through the solder balls 35, the top contact pads 201 and the metallized through vias 217. Optionally, an underfill 38 may be dispensed between the gap between the build-up circuitry 33 and the stiffener 20.

Figure 23:
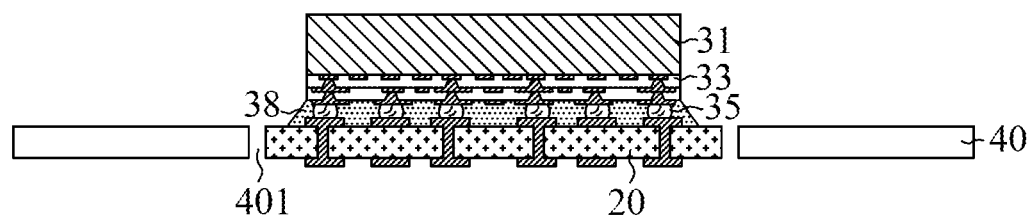
FIG. 23 is a cross-sectional view of the structure of FIG. 22 further provided with a core layer in accordance with the sixth embodiment of the present invention.

FIG. 23 is a cross-sectional view of the structure with the stiffener 20 inserted into a through opening 401 of a core layer 40. The peripheral sidewall of the stiffener 20 is spaced from and laterally surrounded by inner sidewall of the through opening 401 of the core layer 40. The build-up circuitry 33 and the sacrificial carrier 31 are located out of the through opening 401 of the core layer 40.

Figure 24:
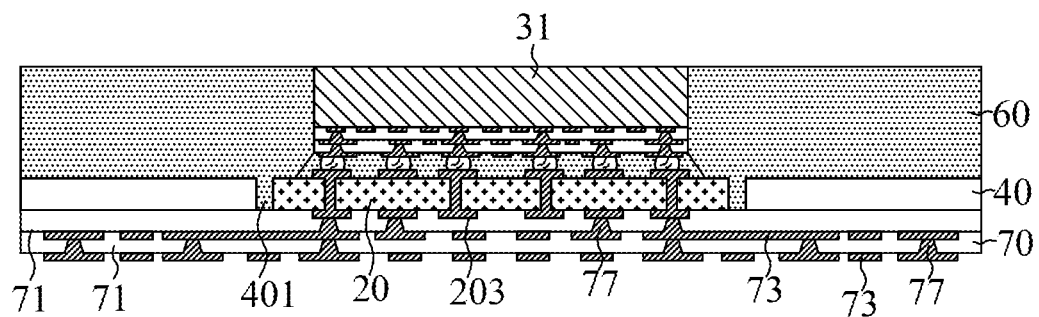
FIG. 24 is a cross-sectional view of the structure of FIG. 23 further provided with a warp balancer and a routing circuitry in accordance with the sixth embodiment of the present invention.

FIG. 24 is a cross-sectional view of the structure provided with a warp balancer 60 and a routing circuitry 70 on two opposite sides of the stiffener 20 and the core layer 40. The warp balancer 60 is disposed over the core layer 40 as well as a portion of the stiffener 20 from above and laterally surrounds and conformally coats the peripheral edges of the sacrificial carrier 31 and the build-up circuitry 33 and further extends into the gap between the peripheral sidewall of the stiffener 20 and the inner sidewall of the through opening 401 of the core layer 40. The routing circuitry 70 covers the bottom surfaces of the stiffener 20 and the core layer 40 and is electrically coupled to the bottom contact pads 203 of the stiffener 20 through metallized vias 77.

Figure 25:
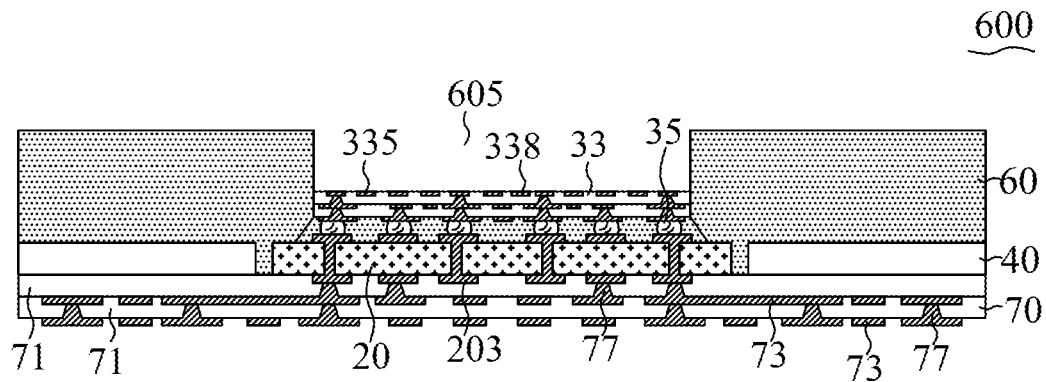
FIG. 25 is a cross-sectional view of the structure of FIG. 24 further formed with a cavity to finish the fabrication of an interconnect substrate in accordance with the sixth embodiment of the present invention.

FIG. 25 is a cross-sectional view of the structure after removal of the sacrificial carrier 31. By removing the sacrificial carrier 31, a cavity 605 is formed by the interior sidewall of the warp balancer 60 and the top surface of build-up circuitry 33, and top terminal pads 338 provided by the topmost routing layer 335 at the top surface of the build-up circuitry 33 are exposed from the cavity 605.

Accordingly, an interconnect substrate 600 is accomplished and includes the stiffener 20, the build-up circuitry 33, the solder balls 35, the core layer 40, the warp balancer 60 and the routing circuitry 70. The stiffener 20 is aligned with and located below the cavity 605 to provide sufficient rigidity at the cavity region so as to suppress bending or deformation of the device-attachment interface. As mentioned above, the ratio of the thickness of the stiffener 20 in millimeters to the opening area of the cavity 605 in square millimeters preferably is controlled to be $1 \times 10^{-5}$ or more for significant favorable effect on anti-warpage. The build-up circuitry 33 is disposed over and supported by the stiffener 20 and provides the top terminal pads 338 for chip assembled in the cavity 605. The CTE of the warp balancer 60 preferably is substantially equal to or close to that of the routing circuitry 70 so as to effectively maintain the required flatness of the interconnect substrate 600. The routing circuitry 70 is electrically coupled to the bottom contact pads 203 of the stiffener 20 and provides electrical contacts for next-level connection from the bottom of the interconnect substrate 600.

Figure 26:
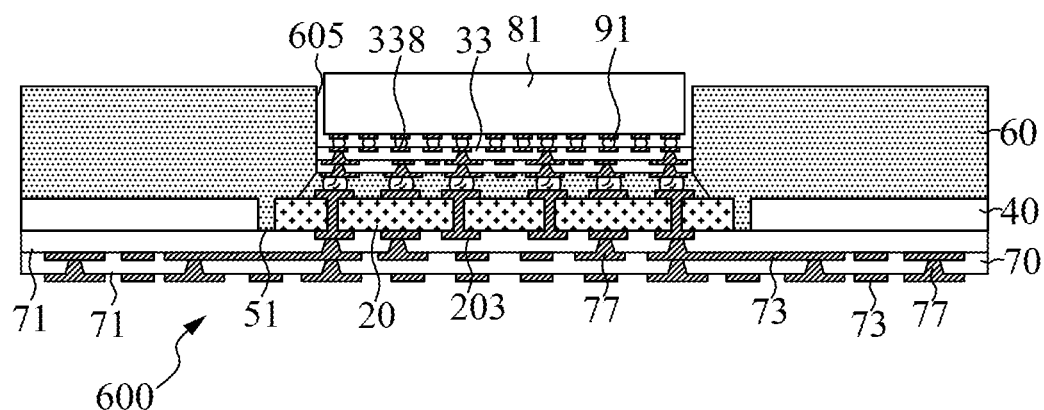
FIG. 26 is a cross-sectional view of a semiconductor assembly having a first semiconductor device electrically connected to the interconnect substrate of FIG. 25 in accordance with the sixth embodiment of the present invention.

FIG. 26 is a cross-sectional view of a semiconductor assembly with a first semiconductor device 81 electrically connected to the interconnect substrate 600 illustrated in FIG. 25. The first semiconductor device 81 is disposed in the cavity 605 and face-down mounted on the top terminal pads 338 of the build-up circuitry 33 at the bottom of the cavity 605 through bumps 91. As a result, the first semiconductor device 81 can be electrically connected to the routing circuitry 70 through the build-up circuitry 33 and the stiffener 20.

Figure 27:
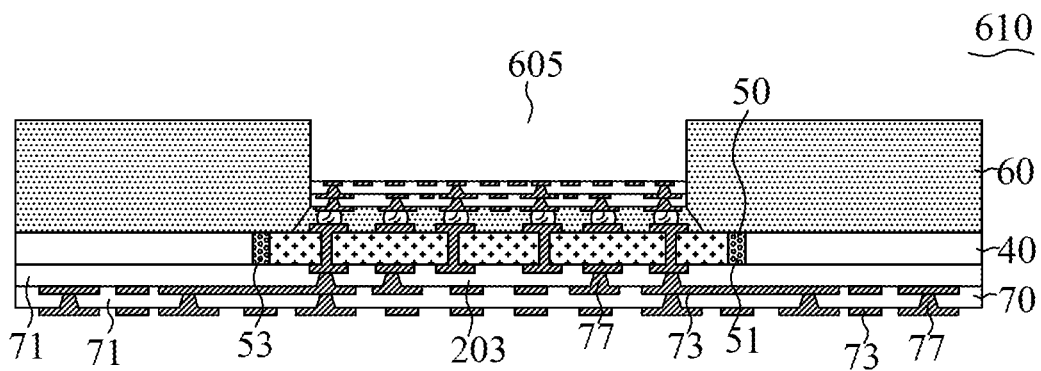
FIG. 27 is a cross-sectional view of another aspect of the interconnect substrate in accordance with the sixth embodiment of the present invention.

FIG. 27 is a cross-sectional view of another aspect of the interconnect substrate in accordance with the sixth embodiment of the present invention. The interconnect substrate 610 is similar to that illustrated in FIG. 25, except that the gap between the stiffener 20 and the core layer 40 is filled with a modified binding matrix 50 before the provision of the warp balancer 60 and the routing circuitry 70. As mentioned above, the modified binding matrix 50 may include low-CTE modulators 53 dispersed in a resin adhesive 51 to reduce the risk of resin cracking.

As illustrated in the aforementioned embodiments, a distinctive interconnect substrate is configured to exhibit improved reliability, which mainly includes a stiffener, a core layer, a warp balancer, a routing circuitry and optionally a build-up circuitry. The interconnect substrates and assemblies described above are merely exemplary. Numerous other embodiments are contemplated. In addition, the embodiments described above can be mixed-and-matched with one another and with other embodiments depending on design and reliability considerations.

The interconnect substrate has a cavity laterally surrounded by an interior sidewall of the warp balancer and completely covered by the stiffener from the cavity bottom. For device connection within the cavity, the interconnect substrate is provided with electrical contacts exposed from the cavity bottom. Specifically, the cavity may be formed by the interior sidewall of the warp balancer and the top surface of the stiffener which includes top contact pads exposed from the cavity bottom as the electrical contacts for device connection. As an alternative, the cavity may be formed by the interior sidewall of the warp balancer and the top surface of the build-up circuitry which includes top terminal pads exposed from the cavity bottom as the electrical contacts for device connection. By specific control in the ratio between the stiffener thickness and the cavity dimension (i.e. the area of the exposed top surface of the stiffener or the build-up circuitry), it can be ensured that the stiffener has sufficient rigidity to compensate the structural weakness caused by the formation of the cavity so as to suppress bending or deformation at the cavity region. Preferably, the ratio of the thickness of the stiffener in millimeters to the dimension of the cavity in square millimeters is controlled to be $1 \times 10^{-5}$ or more.

The stiffener is a non-electronic component exposed from or located below the cavity bottom and has an elastic modulus higher than that of the core layer and the routing circuitry and preferably higher than 100 GPa so as to maintain the flatness of the interconnect substrate and the semiconductor assembly using the same. Specifically, the stiffener may include a supporting base, optionally a top redistribution circuitry, and optionally a bottom redistribution circuitry to provide top contact pads at its top surface and bottom contact pads at its bottom surface. The supporting base, exposed from or located below the cavity bottom, is used to offer the required stiffness and thus typically includes a high-modulus inorganic base plate completely covering the cavity bottom. In a preferred embodiment, the supporting base includes a top wiring layer at its top surface, a bottom wiring layer at its bottom surface, and metallized through vias penetrating through the base plate for vertical electrical connection between the top wiring layer and the bottom wiring layer. For routing redistribution, the top and bottom redistribution circuitries may be optionally disposed over and under the top and bottom surfaces of the supporting base, respectively. The top and bottom redistribution circuitries each typically include at least one insulating layer and at least one routing layer formed in an alternate fashion. For instance, the top redistribution circuitry may include a top insulating layer on the top surface of the supporting base and a top routing layer on the top insulating layer and electrically coupled to the top wiring layer of the supporting base, whereas the bottom redistribution circuitry may include a bottom insulating layer on the bottom surface of the supporting base and a bottom routing layer on the bottom insulating layer and electrically coupled to the bottom wiring layer of the supporting base. As a result, the top routing layer of the top redistribution circuitry can provide the top contact pads of the stiffener, whereas the bottom routing layer of the bottom redistribution circuitry can provide the bottom contact pads of the stiffener. Optionally, the stiffener may further have an aperture aligned with the cavity. More specifically, the aperture of the stiffener has a smaller dimension than the cavity and communicates with the cavity and may further extend into the routing circuitry. Accordingly, the aperture of the stiffener can provide a space for accommodating a semiconductor device therein. Furthermore, as the core layer and the routing circuitry typically include resin dielectric and fiberglass which have very low thermal conductivity, the heat generated from the chip flows through these areas would suffer very high thermal resistance. In such a circumstance, the stiffener can serves as a heat spreader if the thermal conductivity of the stiffener higher than that of the core layer and the routing circuitry.

The core layer is provided around the peripheral sidewall of the stiffener, and may directly contact the peripheral sidewall of the stiffener or have an inner sidewall spaced from the peripheral sidewall of the stiffener. In a preferred embodiment, the core layer has a through opening, and the stiffener disposed in the through opening of core layer can be adhered to the inner sidewall of the through opening using a resin adhesive or a portion of the warp balancer. Typically, the CTE of the resin adhesive may be extremely higher than those of the stiffener and the core layer, and thus is prone to crack induced by internal expansion and shrinkage during thermal cycling in a confined area. In order to reduce the risk of adhesive cracking, a plurality of modulators, having lower CTE than that of the resin adhesive, may be further dispensed in the resin adhesive to form a modified binding matrix in the gap between the peripheral sidewall of the stiffener and the inner sidewall of the through opening. Preferably, the modulators are in an amount of at least 30% (preferably 50% or more) by volume based on the total volume of the gap, and the difference in CTE between the resin adhesive and the modulators is 10 ppm/° C. or more so as to exhibit significant effect. As a result, the modified binding matrix can have CTE lower than 50 ppm/° C., and the internal expansion and shrinkage of the modified binding matrix during thermal cycling can be alleviated so as to restrain its cracking. Furthermore, for effectively releasing thermo-mechanical induced stress, the modified binding matrix preferably has a sufficient width of more than 10 micrometers (more preferably 25 micrometers or more) in the gap to absorb the stress. Further, the modified binding matrix may extend outside of the gap and further cover the bottom surfaces of the stiffener and the core layer. By the lateral extension of the modified binding matrix under the stiffener and the core layer, the interfacial stress between the modified binding matrix and the stiffener and between the modified binding matrix and the core layer can be dispersed so as to conduce to further reduction of cracking risk. Optionally, the core layer may include at least one first vertical connecting element electrically coupled to the routing circuitry. As a result, the core layer can provide signal vertical transduction pathways or/and power delivery and return pathways between the routing circuitry and the warp balancer.

The warp balancer, disposed over the top surface of the core layer, typically contains a resin-based material and may further extend into the gap between the peripheral sidewall of the stiffener and the inner sidewall of the core layer. In order to suppress bending or warpage of the interconnect substrate, the CTE and the thickness of the warp balancer preferably are substantially equal to or close to those of the routing circuitry. For instance, the difference in CTE between the warp balancer and the routing circuitry may be controlled to be less than 20 ppm/° C. so as to effectively maintain the required flatness of the interconnect substrate. In a preferred embodiment, the inner edge portion of the warp balancer is superimposed over the top surface of the stiffener, so that the peripheral portion of the stiffener under the warp balancer can provide support for the inner edge portion of the warp balancer, thereby enhancing the mechanical reliability of the interconnect substrate. Optionally, the warp balancer may include at least one second vertical connecting element electrically coupled to the first vertical connecting element of the core layer. As a result, top conductive pads provided at the top surface of the warp balancer can be electrically connected to the routing circuitry through the first and second vertical connecting elements.

The routing circuitry, disposed under the bottom surfaces of the stiffener and the core layer, includes a conductive trace layer in electrical connection with the bottom contact pads of the stiffener and optionally electrical connection with the first vertical connecting element of the core layer through metallized vias of the conductive trace layer. For instance, the routing circuitry may be a multi-layered build-up circuitry without a core layer and include at least one dielectric layer and at least one conductive trace layer that includes metallized vias in the dielectric layer and extends laterally on the dielectric layer. The dielectric layer and the conductive trace layer are serially formed in an alternate fashion and can be in repetition if needed for further signal routing. As a result, the routing circuitry can be electrically connected to the bottom contact pads of the stiffener and optionally to the first vertical connecting element of the core layer through the metallized vias. In the aspect of the stiffener having the aperture, a portion of the routing circuitry can be exposed from the aperture and the cavity, and the aperture preferably is covered by at least one dielectric layer of the routing circuitry from below.

The optional build-up circuitry, disposed over the top surface of the stiffener, can be electrically coupled to the top contact pads of the stiffener through solder balls and have top terminal pads at the top surface thereof exposed from the cavity. The build-up circuitry typically includes at least one insulating layer and at least one routing layer that includes metallized vias in the insulating layer and extends laterally on the insulating layer. The insulating layer and the routing layer are serially formed in an alternate fashion and can be in repetition if needed for further signal routing. By the stiffener, the build-up circuitry can be electrically connected to the routing circuitry.

The present invention also provides a semiconductor assembly in which a first semiconductor device such as chip is disposed in the cavity of the aforementioned interconnect substrate and electrically connected to the top contact pads of the stiffener. Specifically, the first semiconductor device can be electrically connected to the interconnect substrate using bumps (such as gold or solder bumps). For instance, in the aspect of the top contact pads of the stiffener being exposed from the cavity, the first semiconductor device can be disposed in the cavity and mounted on and electrically coupled to the top surface of the stiffener through bumps in contact with the top contact pads.

As a result, the first semiconductor device can be electrically connected to the routing circuitry through the stiffener. Alternatively, in another aspect of the top terminal pads of the build-up circuitry being exposed from the cavity, the first semiconductor device can be disposed in the cavity and mounted on and electrically coupled to the top surface of the build-up circuitry through bumps in contact with the top terminal pads. In this alternative aspect, the first semiconductor device can be electrically connected to the routing circuitry through the stiffener and the build-up circuitry. Additionally, when the stiffener has the aperture as mentioned above, the semiconductor assembly can further include a second semiconductor device such as chip disposed in the aperture and electrically connected to the first semiconductor device through bumps.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips. The semiconductor device can be a packaged or unpackaged chip. Furthermore, the semiconductor device can be a bare chip, or a wafer level packaged die, etc.

The term "cover" refers to incomplete or complete coverage in a vertical and/or lateral direction For instance, in a preferred embodiment, the cavity is completely covered by the stiffener from below regardless of whether another element (such as the build-up circuitry) is between the stiffener and the cavity.

The term "surround" refers to relative position between elements regardless of whether another element is between the elements. For instance, in a preferred embodiment, the core layer laterally surrounds the stiffener regardless of whether another element (such as the resin adhesive) is between the stiffener and the core layer.

The phrases "mounted on", "attached to", "extend on/onto", "disposed over/on/under", "located below" and "superimposed over" include contact and non-contact between elements. For instance, in a preferred embodiment, the routing circuitry is disposed under the bottom surface of the stiffener and further extends onto the bottom surface of the core layer regardless of whether the routing circuitry contacts or is separated from the core layer and the stiffener by the modified binding matrix.

The phrases "electrical connection", "electrically connected" and "electrically coupled" refer to direct and indirect electrical connection. For instance, in a preferred embodiment, the routing circuitry can be electrically connected to the build-up circuitry by the stiffener but does not contact the build-up circuitry.

The interconnect substrate made by this method is reliable, inexpensive and well-suited for high volume manufacture. The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. An interconnect substrate, comprising:
    a stiffener having top contact pads at a top surface thereof and bottom contact pads at a bottom surface thereof the top contact pads being electrically connected to the bottom contact pads;
    a core layer that laterally surrounds a peripheral sidewall of the stiffener;
    a routing circuitry that is disposed under the bottom surface of the stiffener and further laterally extends onto a bottom surface of the core layer and is electrically coupled to the bottom contact pads of the stiffener; and
    a warp balancer that is disposed over a top surface of the core layer and has an interior sidewall laterally surrounding a cavity, with the top contact pads of the stiffener being aligned with the cavity and a portion of the warp balancer being superimposed over the top surface of the stiffener,
    wherein an elastic modulus of the stiffener is higher than that of the core layer and that of the routing circuitry, and a ratio of a thickness in millimeters to a dimension in square millimeters between a thickness of the stiffener and a dimension of the cavity is $1\times10^{-5}$ or more.

2. The interconnect substrate of claim 1, wherein the difference in coefficient of thermal expansion between the warp balancer and the routing circuitry is less than 20 ppm/° C.

3. The interconnect substrate of claim 1, wherein the elastic modulus of the stiffener is higher than 100 GPa.

4. The interconnect substrate of claim 1, wherein the stiffener further has an aperture aligned with the cavity, and a portion of the routing circuitry is exposed from the cavity and the aperture.

5. The interconnect substrate of claim 1, wherein the interconnect substrate further comprises a build-up circuitry that is disposed over the top surface of the stiffener and electrically coupled to the top contact pads of the stiffener through solder balls, and the build-up circuitry has top terminal pads at a top surface thereof exposed from the cavity.

6. The interconnect substrate of claim 1, wherein the stiffener includes a supporting base and a bottom redistribution circuitry disposed under a bottom surface of the supporting base, and the top contact pads at a top surface of the supporting base are exposed from the cavity and electrically connected to the routing circuitry through the bottom contact pads at a bottom surface of the bottom redistribution circuitry.

7. The interconnect substrate of claim 1, wherein the stiffener includes a supporting base and a top redistribution circuitry disposed over a top surface of the supporting base, and the top contact pads at a top surface of the top redistribution circuitry are exposed from the cavity and electrically connected to the routing circuitry through the bottom contact pads at a bottom surface of the supporting base.

8. The interconnect substrate of claim 1, wherein the core layer has a through opening, and the stiffener is disposed in the through opening of the core layer.

9. The interconnect substrate of claim 8, wherein the stiffener is adhered to an inner sidewall of the through opening through a resin adhesive.

10. The interconnect substrate of claim 9, further comprising a plurality of modulators dispensed in the resin adhesive to form a modified binding matrix in a gap between the peripheral sidewall of the stiffener and the inner sidewall of the through opening, wherein the coefficient of thermal expansion of the modulators is lower than that of the resin adhesive.

11. The interconnect substrate of claim 10, wherein the modified binding matrix extends outside of the gap and further covers the bottom surface of the stiffener and the bottom surface of the core layer.

12. The interconnect substrate of claim 1, wherein the core layer has a first vertical connecting element electrically coupled to the routing circuitry.

13. The interconnect substrate of claim 12, wherein the warp balancer has a second vertical connecting element electrically coupled to the first vertical connecting element.

14. The interconnect substrate of claim 8, wherein the warp balancer further extends into a gap between the peripheral sidewall of the stiffener and an inner sidewall of the through opening.

15. The interconnect substrate of claim 1, wherein a thermal conductivity of the stiffener is higher than that of the core layer and that of the routing circuitry.

16. A semiconductor assembly, comprising:
    the interconnect substrate of claim 1; and
    a first semiconductor device disposed in the cavity and electrically connected to the top contact pads of the stiffener.

17. The semiconductor assembly of claim 16, wherein the stiffener further has an aperture aligned with the cavity, and the semiconductor assembly further comprises a second semiconductor device disposed in the aperture and electrically connected to the first semiconductor device.

18. The semiconductor assembly of claim 16, wherein the difference in coefficient of thermal expansion between the warp balancer and the routing circuitry is lower than 20 ppm/° C.

19. The semiconductor assembly of claim 16, wherein the interconnect substrate further comprises a build-up circuitry that is disposed over the top surface of the stiffener and electrically coupled to the top contact pads of the stiffener through solder balls, and the build-up circuitry has top terminal pads located at the bottom of the cavity and electrically connected to the first semiconductor device through bumps.

20. The semiconductor assembly of claim 16, wherein the stiffener includes a supporting base and a bottom redistribution circuitry disposed under a bottom surface of the supporting base, and the top contact pads at a top surface of the supporting base are electrically connected to the first semiconductor device through bumps and to the routing circuitry through the bottom contact pads at a bottom surface of the bottom redistribution circuitry.

21. The semiconductor assembly of claim 16, wherein the stiffener includes a supporting base and a top redistribution circuitry disposed over a top surface of the supporting base, and the top contact pads at a top surface of the top redistribution circuitry are electrically connected to the first semiconductor device through bumps and to the routing circuitry through the bottom contact pads at a bottom surface of the supporting base.

* * * * *